US010153299B2

(12) United States Patent
Karda et al.

(10) Patent No.: US 10,153,299 B2
(45) Date of Patent: *Dec. 11, 2018

(54) VERTICAL FERROELECTRIC FIELD EFFECT TRANSISTOR CONSTRUCTIONS, CONSTRUCTIONS COMPRISING A PAIR OF VERTICAL FERROELECTRIC FIELD EFFECT TRANSISTORS, VERTICAL STRINGS OF FERROELECTRIC FIELD EFFECT TRANSISTORS, AND VERTICAL STRINGS OF LATERALLY OPPOSING PAIRS OF VERTICAL FERROELECTRIC FIELD EFFECT TRANSISTORS

(71) Applicant: Micron Technology, Inc., Boise, ID (US)

(72) Inventors: Kamal M. Karda, Boise, ID (US); Chandra Mouli, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/398,303

(22) Filed: Jan. 4, 2017

(65) Prior Publication Data

US 2017/0117295 A1    Apr. 27, 2017

Related U.S. Application Data

(60) Continuation of application No. 15/095,211, filed on Apr. 11, 2016, now Pat. No. 9,559,118, which is a
(Continued)

(51) Int. Cl.
*H01L 27/11597* (2017.01)
*H01L 27/1159* (2017.01)
(Continued)

(52) U.S. Cl.
CPC .. *H01L 27/11597* (2013.01); *H01L 21/02568* (2013.01); *H01L 21/28291* (2013.01);
(Continued)

(58) Field of Classification Search
None
See application file for complete search history.

(56) References Cited

U.S. PATENT DOCUMENTS 6,336,544 B1   1/2002   Chiang
6,339,544 B1   1/2002   Chiang et al.
(Continued)

FOREIGN PATENT DOCUMENTS

CN   1490880   4/2004
EP   1624479   2/2006
(Continued)

OTHER PUBLICATIONS

WO PCT/US2016/42719, Oct. 20, 2016, Written Opinion.
WO PCT/US2016/42719, Oct. 20, 2016, Search Report.

*Primary Examiner* — Michelle Mandala
(74) *Attorney, Agent, or Firm* — Wells St. John P.S.

(57) ABSTRACT

A vertical ferroelectric field effect transistor construction comprises an isolating core. A transition metal dichalcogenide material encircles the isolating core and has a lateral wall thickness of 1 monolayer to 7 monolayers. A ferroelectric gate dielectric material encircles the transition metal dichalcogenide material. Conductive gate material encircles the ferroelectric gate dielectric material. The transition metal dichalcogenide material extends elevationally inward and elevationally outward of the conductive gate material. A conductive contact is directly against a lateral outer sidewall of the transition metal dichalcogenide material that is a) elevationally inward of the conductive gate material, or b)
(Continued)

elevationally outward of the conductive gate material. Additional embodiments are disclosed.

26 Claims, 7 Drawing Sheets

Related U.S. Application Data division of application No. 13/964,309, filed on Aug. 12, 2013, now Pat. No. 9,337,210.

(51) Int. Cl.
| | |
|---|---|
| H01L 27/11585 | (2017.01) |
| H01L 21/02 | (2006.01) |
| H01L 21/28 | (2006.01) |
| H01L 29/51 | (2006.01) |
| H01L 29/66 | (2006.01) |
| H01L 29/06 | (2006.01) |
| H01L 29/10 | (2006.01) |
| H01L 29/24 | (2006.01) |
| H01L 29/78 | (2006.01) |
| H01L 29/786 | (2006.01) |
| H01L 29/423 | (2006.01) |
| H01L 29/49 | (2006.01) |
| H01L 27/1157 | (2017.01) |
| H01L 27/11582 | (2017.01) |
| H01L 27/11578 | (2017.01) |
| H01L 27/11514 | (2017.01) |
| G11C 11/22 | (2006.01) |

(52) U.S. Cl.
CPC ...... *H01L 27/1157* (2013.01); *H01L 27/1159* (2013.01); *H01L 27/11582* (2013.01); *H01L 27/11585* (2013.01); *H01L 29/0649* (2013.01); *H01L 29/1037* (2013.01); *H01L 29/24* (2013.01); *H01L 29/42384* (2013.01); *H01L 29/42392* (2013.01); *H01L 29/4908* (2013.01); *H01L 29/516* (2013.01); *H01L 29/6684* (2013.01); *H01L 29/7827* (2013.01); *H01L 29/78642* (2013.01); *H01L 29/78681* (2013.01); *G11C 11/22* (2013.01); *H01L 27/11514* (2013.01); *H01L 27/11578* (2013.01); *H01L 2029/42388* (2013.01)

(56) References Cited

U.S. PATENT DOCUMENTS

| | | | |
|---|---|---|---|
| 6,717,838 | B2 | 4/2004 | Hosoi |
| 6,862,214 | B2 | 3/2005 | Lee et al. |
| 7,378,286 | B2 | 5/2008 | Hsu et al. |
| 7,573,083 | B2 | 8/2009 | Kijima et al. |
| 8,004,871 | B2 | 8/2011 | Kaneko et al. |
| 8,026,546 | B2 | 9/2011 | Murata et al. |
| 8,399,874 | B2 | 3/2013 | Hwang |
| 8,634,257 | B2 | 1/2014 | Hanzawa et al. |
| 9,305,929 | B1 | 4/2016 | Karda et al. |
| 2001/0039091 | A1 | 11/2001 | Nakagawa |
| 2003/0001189 | A1 | 1/2003 | Fujiwara et al. |
| 2003/0006446 | A1 | 1/2003 | Forbes et al. |
| 2003/0021479 | A1 | 1/2003 | Oku |
| 2003/0075753 | A1 | 4/2003 | Chu et al. |
| 2004/0002176 | A1 | 1/2004 | Xu |
| 2004/0070017 | A1 | 4/2004 | Yang et al. |
| 2004/0173874 | A1 | 9/2004 | Saigoh |
| 2004/0266045 | A1 | 12/2004 | Mears et al. |
| 2005/0237779 | A1 | 10/2005 | Kang |
| 2006/0124987 | A1 | 6/2006 | Won et al. |
| 2007/0035984 | A1 | 2/2007 | Arai |
| 2007/0236979 | A1 | 10/2007 | Takashima |
| 2007/0285970 | A1 | 12/2007 | Toda et al. |
| 2008/0182358 | A1 | 7/2008 | Cowdery-Corvan et al. |
| 2008/0191267 | A1 | 8/2008 | Shin |
| 2008/0217600 | A1 | 9/2008 | Gidon |
| 2008/0265235 | A1 | 10/2008 | Kamigaichi et al. |
| 2009/0029513 | A1 | 1/2009 | Blanchard |
| 2009/0045390 | A1 | 2/2009 | Rinerson et al. |
| 2009/0141547 | A1 | 6/2009 | Jin |
| 2009/0250681 | A1 | 10/2009 | Smythe et al. |
| 2010/0039850 | A1 | 2/2010 | Kitazaki |
| 2010/0207168 | A1 | 8/2010 | Sills et al. |
| 2010/0232200 | A1 | 9/2010 | Shepard |
| 2010/0270529 | A1 | 10/2010 | Lung |
| 2011/0012085 | A1 | 1/2011 | Deligianni et al. |
| 2011/0037046 | A1 | 2/2011 | Sato et al. |
| 2011/0210326 | A1 | 9/2011 | Suzawa et al. |
| 2011/0261607 | A1 | 10/2011 | Tang |
| 2011/0292713 | A1 | 12/2011 | Perner |
| 2012/0001144 | A1 | 1/2012 | Greeley et al. |
| 2012/0007167 | A1 | 1/2012 | Hung et al. |
| 2012/0052640 | A1 | 3/2012 | Fischer et al. |
| 2012/0140542 | A1 | 6/2012 | Liu |
| 2012/0164798 | A1 | 6/2012 | Sills et al. |
| 2012/0187363 | A1 | 7/2012 | Liu |
| 2012/0211722 | A1 | 8/2012 | Kellam et al. |
| 2012/0243306 | A1 | 9/2012 | Karpov et al. |
| 2012/0256246 | A1 | 10/2012 | Izumi |
| 2012/0292686 | A1 | 11/2012 | Son et al. |
| 2013/0020575 | A1 | 1/2013 | Ishizuka et al. |
| 2013/0056699 | A1 | 3/2013 | Lung |
| 2013/0092894 | A1 | 4/2013 | Sills et al. |
| 2013/0099303 | A1 | 4/2013 | Huang et al. |
| 2013/0153984 | A1 | 6/2013 | Ramaswamy |
| 2013/0193400 | A1 | 8/2013 | Sandhu et al. |
| 2014/0034896 | A1 | 2/2014 | Ramaswamy et al. |
| 2014/0077150 | A1 | 3/2014 | Ho et al. |
| 2014/0097484 | A1 | 4/2014 | Seol et al. |
| 2014/0252298 | A1 | 9/2014 | Li et al. |
| 2014/0353568 | A1 | 12/2014 | Boniardi et al. |
| 2015/0097154 | A1 | 4/2015 | Kim et al. |
| 2015/0102280 | A1 | 4/2015 | Lee |
| 2015/0123066 | A1 | 5/2015 | Gealy et al. |
| 2015/0243708 | A1 | 8/2015 | Ravasio et al. |
| 2015/0248931 | A1 | 9/2015 | Nazarian |
| 2015/0340610 | A1 | 11/2015 | Jung et al. |
| 2016/0043143 | A1 | 2/2016 | Sakotsubo |
| 2016/0104748 | A1 | 4/2016 | Ravasio et al. |

FOREIGN PATENT DOCUMENTS

| | | |
|---|---|---|
| EP | 14836755.0 | 2/2017 |
| EP | 15810281 | 1/2018 |
| JP | H09-232447 | 9/1997 |
| JP | H10-93083 | 10/1998 |
| JP | 1193083 | 4/1999 |
| JP | H11-274429 | 10/1999 |
| JP | 2006-060209 | 3/2006 |
| JP | 2007-157982 | 6/2007 |
| JP | 2009-272513 | 11/2009 |
| JP | 2009-295255 | 12/2009 |
| JP | 2012-238348 | 12/2012 |
| KR | 10-2005-0102951 | 10/2005 |
| KR | 10-2015-0041705 | 4/2015 |
| WO | WO 1999/014761 | 3/1999 |
| WO | PCT/US2014/068287 | 12/2014 |
| WO | PCT/US2015/039480 | 10/2015 |
| WO | PCT/US2014/068287 | 7/2016 |
| WO | PCT/US2015/025894 | 10/2016 |
| WO | PCT/US2015/032999 | 12/2016 |
| WO | PCT/US2015/039480 | 4/2017 |
| WO | PCT/US2016/040131 | 1/2018 |
| WO | PCT/US2016/042719 | 1/2018 |

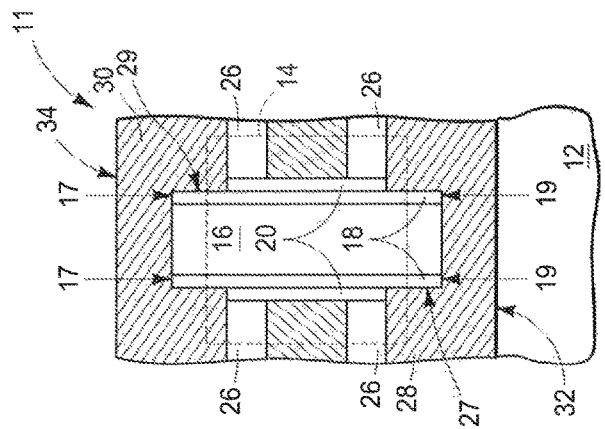
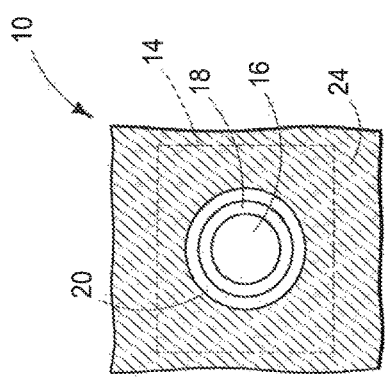
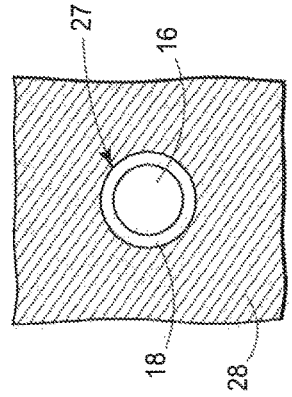
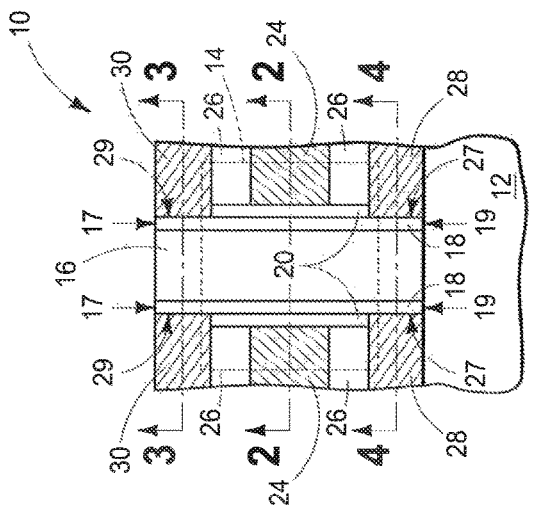
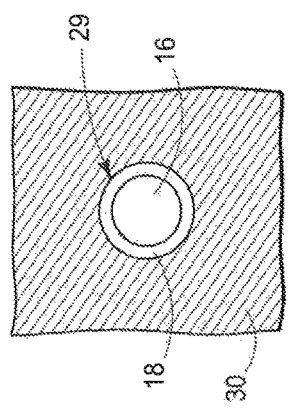

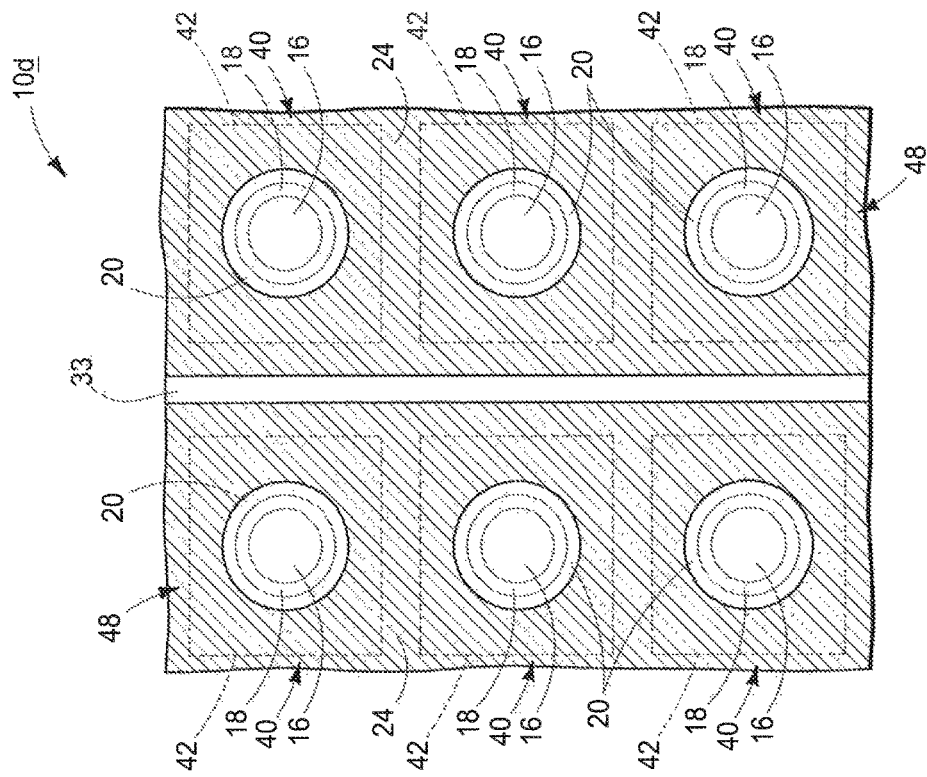
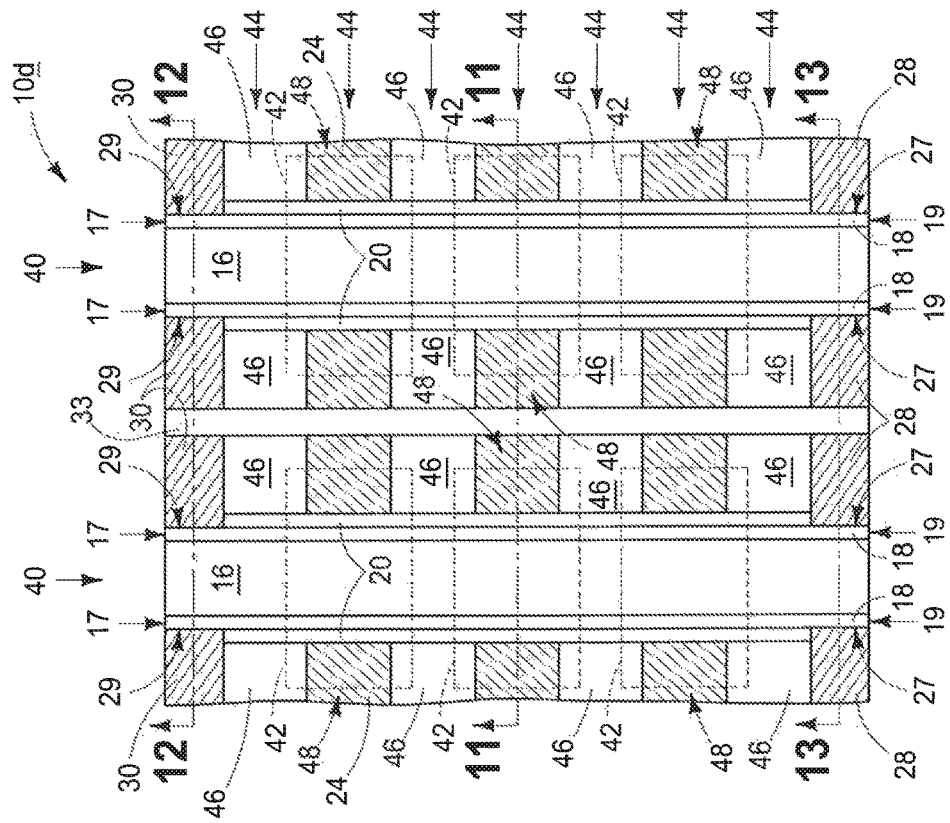
FIG. 11
FIG. 10

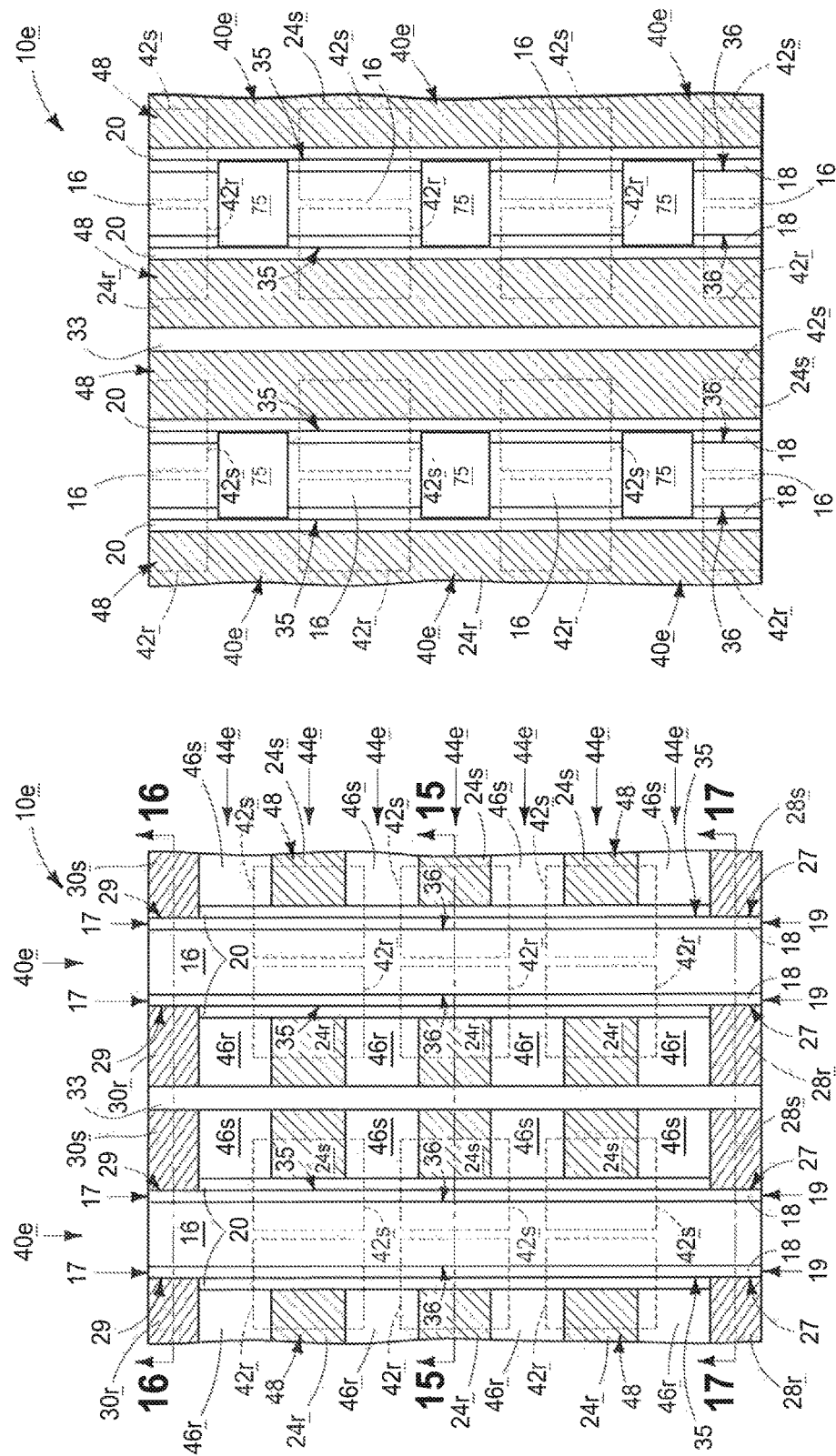

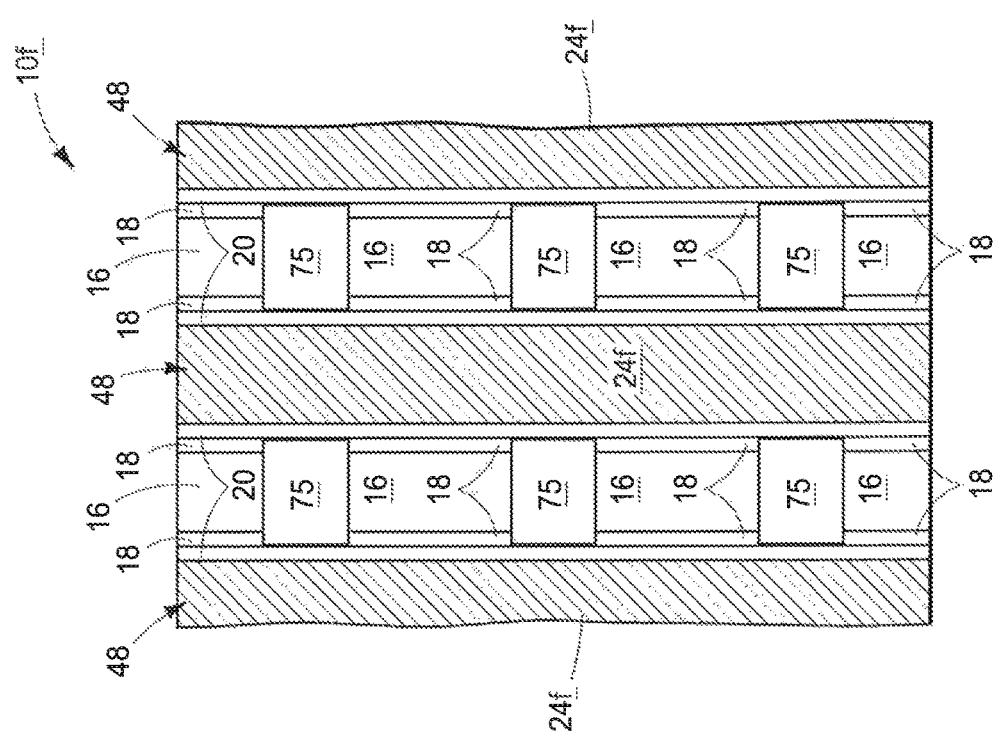

VERTICAL FERROELECTRIC FIELD EFFECT TRANSISTOR CONSTRUCTIONS, CONSTRUCTIONS COMPRISING A PAIR OF VERTICAL FERROELECTRIC FIELD EFFECT TRANSISTORS, VERTICAL STRINGS OF FERROELECTRIC FIELD EFFECT TRANSISTORS, AND VERTICAL STRINGS OF LATERALLY OPPOSING PAIRS OF VERTICAL FERROELECTRIC FIELD EFFECT TRANSISTORS

RELATED PATENT DATA

This patent resulted from a continuation application of U.S. patent application Ser. No. 15/095,211, filed Apr. 11, 2016, entitled "Vertical Ferroelectric Field Effect Transistor Constructions, Constructions Comprising A Pair Of Vertical Ferroelectric Field Effect Transistors, Vertical Strings Of Ferroelectric Field Effect Transistors, And Vertical Strings Of Laterally Opposing Pairs Of Vertical Ferroelectric Field Effect Transistors", naming Kamal M. Karda, Chandra Mouli, and Gurtej S. Sandhu as inventors, which was a divisional application of U.S. patent application Ser. No. 13/964,309, filed Aug. 12, 2013, now U.S. Pat. No. 9,337,210, the disclosures of which are incorporated by reference.

TECHNICAL FIELD

Embodiments disclosed herein pertain to vertical ferroelectric field effect transistor constructions, to constructions comprising a pair of vertical ferroelectric field effect transistors, to vertical strings of ferroelectric field effect transistors, and to vertical strings of laterally opposing pairs of vertical ferroelectric field effect transistors.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, sense lines, or data/sense lines) and access lines (which may also be referred to as word lines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile or non-volatile. Non-volatile memory cells can store data for extended periods of time, in many instances including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate dielectric. Application of a suitable voltage to the gate allows current to flow from one of the source/drain regions to the other through the channel region. When the voltage is removed from the gate, current is largely prevented from flowing through the channel region. Field-effect transistors may also include additional structure, for example reversibly programmable charge storage regions as part of the gate construction. Transistors other than field-effect transistors, for example bipolar transistors, may additionally or alternately be used in memory cells. Transistors may be used in many types of memory. Further, transistors may be used and formed in arrays other than memory.

One type of transistor is a ferroelectric field effect transistor (FeFET), wherein the gate dielectric is ferroelectric. The polarization of the ferroelectric, aligned by applying a programming gate voltage, modifies the conductivity of the semiconductive channel between source and drain for a selected operating gate voltage. A suitable positive programming voltage directs the polarization along the semiconducting channel. This polarization of ferroelectric results in positive sheet charge closer to the channel and negative sheet charge closer to the gate. When considering a p-type semiconductor, accumulation of electrons at the interface occurs to compensate this ferroelectric charge. A low resistivity channel is thereby created. When switching the polarization to its other stable state, the ferroelectric polarization is aligned such that negative sheet charge is closer to the channel and the electrons in the semiconductive channel close the gate dielectric get depleted. This leads to high resistivity. The preference for high and low conductance, invoked by the ferroelectric polarization state, remains after removal of the programming gate voltage (at least for a time). The status of the channel can be read by applying a small drain voltage which does not disturb the ferroelectric polarization.

However, FeFETs can uncontrollably become depolarized, and hence lose a program state. Further, very high electric fields may exist between a typical thin oxide that is between the ferroelectric dielectric material and the channel causing reliability problems in operation.

BRIEF DESCRIPTION OF THE DRAWINGS

FIG. 1 is a diagrammatic sectional view of a substrate fragment in accordance with an embodiment of the invention.

FIG. 2 is a sectional view taken through line 2-2 in FIG. 1.

FIG. 3 is a sectional view taken through line 3-3 in FIG. 1.

FIG. 4 is a sectional view taken through line 4-4 in FIG. 1.

FIG. 5 is a diagrammatic sectional view of a substrate fragment in accordance with an embodiment of the invention, and is an alternative to that shown by FIG. 1.

FIG. 10 is a diagrammatic sectional view of a substrate fragment in accordance with an embodiment of the invention.

FIG. 11 is a sectional view taken through line 11-11 in FIG. 10.

FIG. 14 is a diagrammatic sectional view of a substrate fragment in accordance with an embodiment of the invention, and is an alternative to that shown by FIG. 10

FIG. 15 is a sectional view taken through line 15-15 in FIG. 14.

FIG. 18 is a diagrammatic sectional view of a substrate fragment in accordance with an embodiment of the invention, and is an alternative to that shown by FIG. 15.

DETAILED DESCRIPTION OF EXAMPLE EMBODIMENTS

Figure 6:
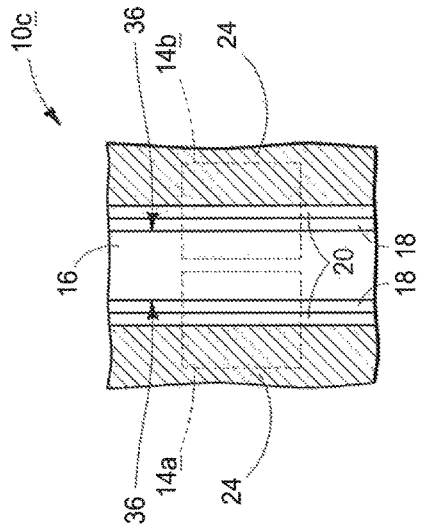
FIG. 6 is a diagrammatic sectional view of a substrate fragment in accordance with an embodiment of the invention, and is an alternative to that shown by FIG. 1.
Figure 7:
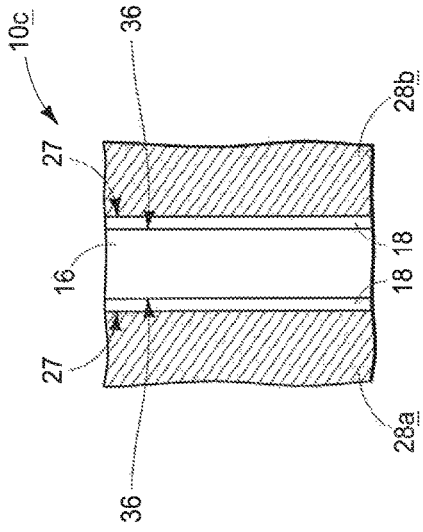
FIG. 7 is a sectional view taken through line 7-7 in FIG. 6.

An example embodiment vertical ferroelectric field effect transistor construction is described initially with reference to FIGS. 1-4. In this document, horizontal refers to a general direction along a primary surface relative to which a substrate is processed during fabrication, and vertical is a direction generally orthogonal thereto. Further, "vertical" and "horizontal" as used herein are generally perpendicular directions relative one another independent of orientation of the substrate in three-dimensional space. Additionally, "elevational" and "elevationally" are with reference to the vertical direction relative to a base substrate upon which the circuitry has been fabricated.

An example substrate fragment 10 comprises dielectric material 12 having various materials formed there-over which comprise a vertical ferroelectric field effect transistor construction 14 (FIG. 1). Example dielectric materials 12 are doped silicon dioxide, undoped silicon dioxide, and/or silicon nitride. Other partially or wholly fabricated components of integrated circuitry may be formed as part of or be elevationally inward of material 12, and are not particularly germane to the inventions disclosed herein.

Any of the materials and/or structures described herein may be homogenous or non-homogenous, and regardless may be continuous or discontinuous over any material which such overlie. As used herein, "different composition" only requires those portions of two stated materials that may be directly against one another to be chemically and/or physically different, for example if such materials are not homogenous. If the two stated materials are not directly against one another, "different composition" only requires that those portions of the two stated materials that are closest to one another be chemically and/or physically different if such materials are not homogenous. In this document, a material or structure is "directly against" another when there is at least some physical touching contact of the stated materials or structures relative one another. In contrast, "over", "on", and "against" not preceded by "directly", encompass "directly against" as well as construction where intervening material(s) or structure(s) result(s) in no physical touching contact of the stated materials or structures relative one another. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Substrate fragment 10 may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Transistor construction 14 comprises an isolating core 16 (i.e., electrically isolating). Material of isolating core 16 may be dielectric, including for example any of the materials described above with respect to the composition of material 12. The material of isolating core 16 may be semiconductive or conductive, and for example may provide an electrically isolating function for circuitry components above and/or below (not shown) transistor construction 14, for example being held at ground or some other potential.

A transition metal dichalcogenide material 18 encircles isolating core 16 and has a lateral wall thickness of 1 monolayer to 7 monolayers. In one embodiment, transition metal dichalcogenide material 18 is no greater than 4 monolayers in lateral wall thickness, and in one embodiment no greater than 2 monolayers in lateral wall thickness. Example materials include one or more of $MoS_2$, $WS_2$, $InS_2$, $MoSe_2$, $WSe_2$, and $InSe_2$. Transition metal dichalcogenide material 18 may be considered as having an elevationally outermost end surface 17 and an elevationally innermost end surface 19.

A ferroelectric gate dielectric material 20 encircles transition metal dichalcogenide material 18. In one embodiment, ferroelectric gate dielectric material 20 has a lateral wall thickness of 1 nanometer to 30 nanometers, and in one embodiment a lateral wall thickness of 2 nanometers to 10 nanometers. Example materials include $Hf_xSi_yO_z$ and $Hf_xZr_yO_z$.

Isolating core 16, transition metal dichalcogenide material 18, and ferroelectric gate dielectric material 20 are each shown as having a respective perimeter that is circular in horizontal cross-section. Other shapes may be used.

Conductive gate material 24 encircles ferroelectric gate dielectric material 20. Examples include one or more of elemental metal(s), an alloy of two or more elemental metals, conductive metal compounds, and conductively-doped semiconductive material. Transition metal dichalcogenide material 18 extends elevationally inward and elevationally outward of conductive gate material 24. In one embodiment, ferroelectric gate dielectric material 20 extends elevationally inward and elevationally outward of conductive gate material 24. Dielectric material 26 may be elevationally over and elevationally under conductive gate material 24. Examples include any of the materials described above with respect to the composition of material 12. Transition metal dichalcogenide material 18 may be considered as having a lateral outer sidewall 27 that is elevationally inward of conductive gate material 24 and a lateral outer sidewall 29 that is elevationally outward of conductive gate material 24.

A conductive contact is directly against a lateral outer sidewall of the transition metal dichalcogenide material that is a) elevationally inward of the conductive gate material, or b) elevationally outward of the conductive gate material. FIGS. 1, 3, and 4 show such a conductive contact 28 and another such conductive contact 30. Conductive contact 28 is directly against lateral outer sidewall 27 of material 18 that is elevationally inward of gate material 24. Conductive contact 30 is directly against lateral outer sidewall 29 of material 18 that is elevationally outward of gate material 24. Conductive material of the conductive contact is of different composition from that of the transition metal dichalcogenide material. In ideal embodiments, the material of the conductive contact that is directly against sidewall 27/29 is elemental metal, an alloy of two or more elemental metals, and/or a conductive metal compound. In a lesser ideal embodiment, material of the conductive contact that is directly against the sidewall is conductively-doped semiconductive material. Conductive contact 28 and/or 30 may extend to or comprise a part of a conductive line (not shown in FIGS. 1-4) for connecting the conductive contact(s) with other circuitry components (not shown). Additionally or alternately, and as an example, the conductive contact 28 or 30 may connect with a conductive plate-like structure (not shown) that interconnects source/drains across rows and columns of a plurality of such transistors. Regardless, source/drains may be respective portions of material 18 that are atop and/or below conductive gate material 24 of transistor construction 14.

FIG. 1 depicts an example embodiment wherein the individual conductive contacts are not directly against the one of end surfaces 17, 19 that is most-proximate the lateral outer sidewall of the transition metal dichalcogenide material that the conductive contact is laterally directly against. Alternately, one or both of the conductive contacts may be directly against that most-proximate end surface. For example, FIG. 5 shows an alternate embodiment substrate fragment 11 wherein conductive contact 28 is also directly against end surface 19 and conductive contact 30 is also directly against end surface 17. Like numerals from the above-described embodiments have been used where appropriate, with some construction differences being indicated with different numerals. While FIG. 5 shows an embodiment where both conductive contacts 28 and 30 are directly against their respective end surfaces, only a single of such contacts may be so-directly against where both contacts happen to be directly against sidewalls of transition metal dichalcogenide material 18. In one embodiment, sidewall-surface area of the transition metal dichalcogenide material that the conductive contact is directly against is greater than endwall-surface area of the transition metal dichalcogenide material that the conductive contact is directly against. FIG. 5 shows one such example embodiment. FIG. 5 also shows an example embodiment wherein conductive contacts 28 and 30 comprise part of conductive lines 32 and 34, respectively.

An alternate embodiment construction is next described with reference to FIGS. 6-9 and a substrate fragment 10c, and which comprises a pair of laterally opposing vertical ferroelectric field effect transistors 14a, 14b. Like numerals from the above-described embodiments have been used where appropriate, with some construction differences being indicated with the suffixes "a", "b", and "c", or with different numerals. Isolating material 16 is laterally between the pair of vertical ferroelectric field effect transistors 14a and 14b. The pair of transistors comprises a transition metal dichalcogenide film 18 over each of two opposing lateral sides 36 of isolating material 16, with each having a lateral thickness of 1 monolayer to 7 monolayers. A ferroelectric gate dielectric film 20 is laterally outward of each transition metal dichalcogenide film 18. Conductive gate material 24 is laterally outward of each ferroelectric gate dielectric film 20. Transition metal dichalcogenide films 18 extend elevationally inward and elevationally outward of conductive gate material 24 on each of the two sides 36.

Figure 8:
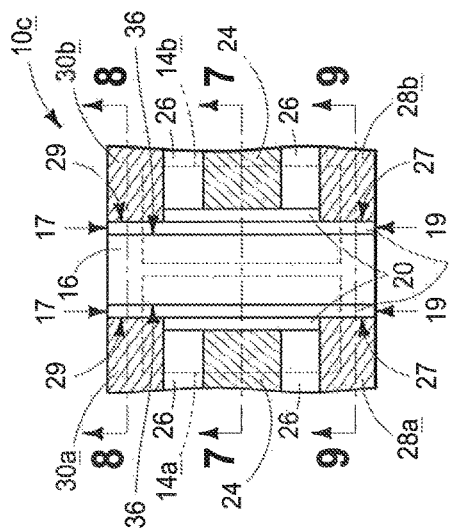
FIG. 8 is a sectional view taken through line 8-8 in FIG. 6.
Figure 9:
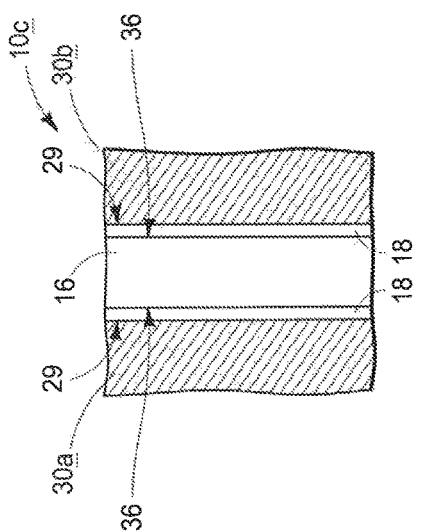
FIG. 9 is a sectional view taken through line 9-9 in FIG. 6.

A conductive contact is directly against a lateral outer sidewall of each of the transition metal dichalcogenide films that is a) elevationally inward of the conductive gate material, or b) elevationally outward of the conductive gate material. FIGS. 6 and 8 show two conductive contacts 30a, 30b that are directly against lateral outer sidewall 29 of each transition metal dichalcogenide film 18 that is elevationally outward of conductive gate material 24. FIGS. 6 and 9 also show two conductive contacts 28a, 28b that are individually directly against lateral outer sidewall 27 of each transition metal dichalcogenide film 18 that is elevationally inward of conductive gate material 24. Conductive contacts 28a and 28b may be considered as a single or unitary conductive contact if such connect and thereby directly electrically couple with one another, or may be considered as two separate contacts if not so electrically coupled. The same applies with respect to conductive contacts 30a and 30b. Regardless, any of the attributes described above with respect to conductive contacts 28 and 30 in substrates 10 and 11 may be used in the FIGS. 6-9 embodiments.

Embodiments of the invention encompass a vertical string of vertical ferroelectric field effect transistors, and are next described with reference to FIGS. 10-13. Like numerals from the above-described embodiments have been used where appropriate, with some construction differences being indicated with the suffix "d", or with different numerals. FIGS. 10-13 show a substrate fragment 10d comprising an array of vertical strings 40 (e.g., only six being shown) of vertical ferroelectric field effect transistors 42 (e.g., only three per string being shown). More transistors than three would likely be included per string, and many more than six strings would likely be in a given array (i.e., including a sub-array). Further, vertical strings 40 may be arrayed in other than the depicted side-by-side arrangement. As an example, some or all vertical strings 40 in adjacent rows and/or columns may be diagonally staggered (not shown). The discussion proceeds with respect to construction associated with a single vertical string 40. Vertical string 40 of vertical ferroelectric field effect transistors 42 comprises an isolating core 16. A transition metal dichalcogenide material 18 encircles isolating core 16 and has a lateral thickness of 1 monolayer to 7 monolayers. A ferroelectric gate dielectric material 20 encircles transition metal dichalcogenide material 18.

Alternating tiers 44 of dielectric material 46 and conductive gate material 24 encircle ferroelectric gate dielectric material 20. Example dielectrics 26 include any of the materials described above with respect to the composition of material 12. Tiers 44 may be of any selected thickness, and may be of different thicknesses. Transition metal dichalcogenide material 18 and ferroelectric gate dielectric material 20 extend elevationally along isolating core 16 though tiers 44. The transition metal dichalcogenide material extends elevationally beyond at least one of a) an elevationally outer of the conductive gate material tiers (e.g., the top-most tier 44 that comprises material 24), and b) an elevationally inner of the conductive gate material tiers (e.g., the bottom-most tier 44 that comprises material 24). FIGS. 10-13 depict an example embodiment transition metal dichalcogenide material 18 that extends elevationally beyond each of the elevationally outer and the elevationally inner conductive gate material tiers 44. Regardless and in one embodiment, the elevationally outer tier may comprise dielectric material (e.g., the top-most tier 44 that comprises material 46), and in one such embodiment the transition metal dichalcogenide material 18 may extend elevationally beyond elevationally outer dielectric material tier 44, for example as shown. In one embodiment, the elevationally inner tier may comprise dielectric material (e.g., the bottom-most tier 44 that comprises material 46), and in one such embodiment the transition metal dichalcogenide material 18 may extend elevationally beyond elevationally inner dielectric material tier 44, for example as shown.

Figure 13:
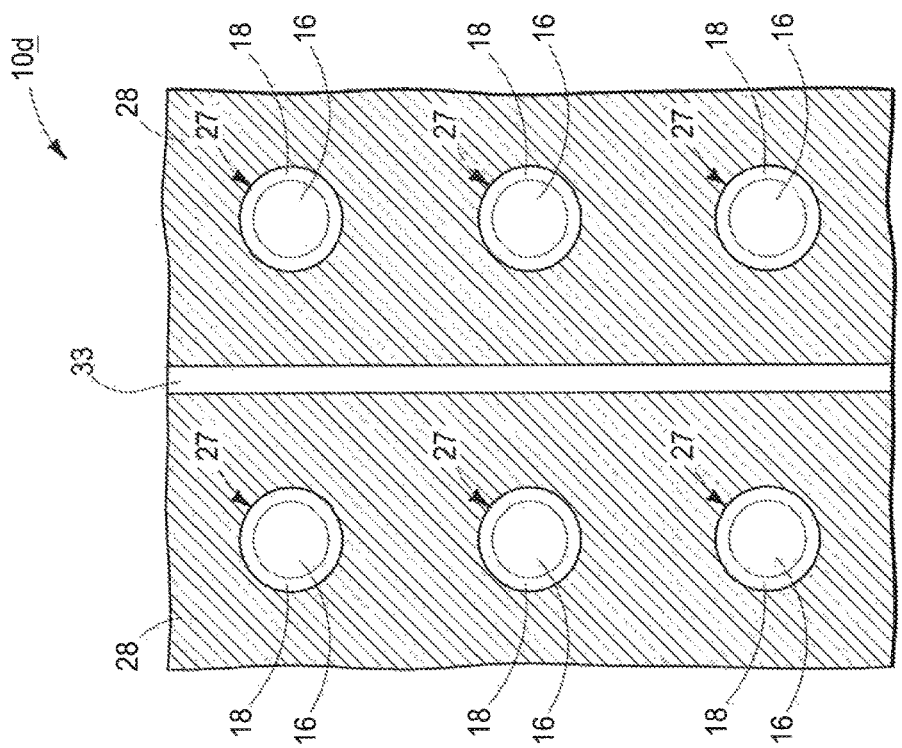
FIG. 13 is a sectional view taken through line 13-13 in FIG. 10.
Figure 12:
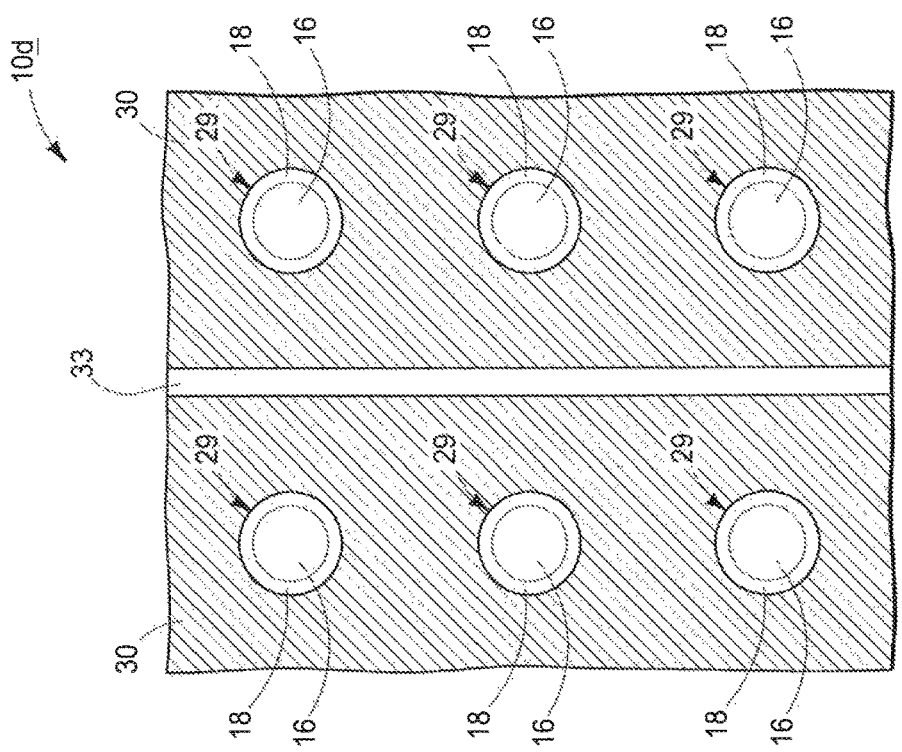
FIG. 12 is a sectional view taken through line 12-12 in FIG. 10.

A conductive contact is directly against a lateral outer sidewall of transition metal dichalcogenide material that is elevationally beyond a) the outer tier of the conductive gate material, or b) the inner tier of the conductive gate material. FIGS. 10 and 12 show a conductive contact 30 directly against lateral outer sidewall 29 of transition metal dichalcogenide material 18 that is elevationally beyond outer conductive gate material tier 44. FIGS. 10 and 13 also show another conductive contact 28 directly against lateral outer sidewall 27 of transition metal dichalcogenide material 18 that is elevationally beyond inner conductive gate material tier 44. Any of the attributes as described above with respect to the embodiments of FIGS. 1-5 may be used. In one embodiment, vertical string 40 may be configured as a NAND string, for example and by way of example only, analogous to architecture as disclosed in U.S. Pat. No. 7,898,850.

FIG. 10-13 show example vertical strings 40 arrayed in a row and column manner, with conductive gate material 24 comprising access or word lines 48 in individual of tiers 44 and which are electrically isolated relative one another in the depicted views by a suitable dielectric material 33. Examples include any of the materials described above with respect to the composition of material 12. Conductive contacts 28 or conductive contacts 30 may connect with a set of sense/bit lines (not shown). The other of contacts 28 or 30 may connect with a different set of lines (not shown) or perhaps a plate-like structure (not shown) that interconnects source/drains across rows and columns of a plurality of such transistors. Regardless, source/drains may be respective portions of material 18 that are atop and below conductive gate material 24 of the top-most and bottom-most transistor construction 42 in a string 40. Regardless, any of the lines may be arrayed in any suitable manner. As but one example, sense lines (not shown) may be oriented perpendicular to the access lines, and lines (not shown) which connect with columns or rows of contacts 28 and 30 may run parallel relative one another and the sense lines.

Additional example embodiments of strings of vertical ferroelectric field effect transistors are next described with reference to FIGS. 14-17 and a substrate fragment 10e. Like numerals from the above-described embodiments have been used where appropriate, with some construction differences being indicated with the suffixes "e", "r", and "s", or with different numerals. FIG. 14 shows alternating tiers 44e of laterally opposing dielectric material 46r and 46s and of laterally opposing conductive gate material 24r and 24s. Laterally opposing conductive gate material 24r and 24s in individual tiers 44e comprise a respective gate of one of a pair of laterally opposing vertical ferroelectric field effect transistors 14r and 14s in that individual tier 44e. Isolating material 16 extends through tiers 44e laterally between transistors 42r and 42s of the respective pairs of transistors. A transition metal dichalcogenide film 18 extends through tiers 44e over each of two opposing lateral sides 36 of isolating material 16 between isolating material 16 and laterally opposing conductive gate material 24r and 24s. Transition metal dichalcogenide films 18 individually have a lateral thickness of 1 monolayer to 7 monolayers.

Transition metal dichalcogenide films 18 extend elevationally beyond at least one of a) an elevationally outer of the laterally opposing conductive gate material tiers (e.g., the top-most tier 44e that comprises gate material 24r, 24s), and b) an elevationally inner of the laterally opposing conductive gate material tiers (e.g., the bottom-most tier 44e that comprises conductive gate material 24r, 24s). A ferroelectric gate dielectric film 20 extends through tiers 44e over each of two opposing lateral sides 35 of the individual transition metal dichalcogenide films 18 between transition metal dichalcogenide films 18 and laterally opposing conductive gate material 24r and 24s.

Figure 17:
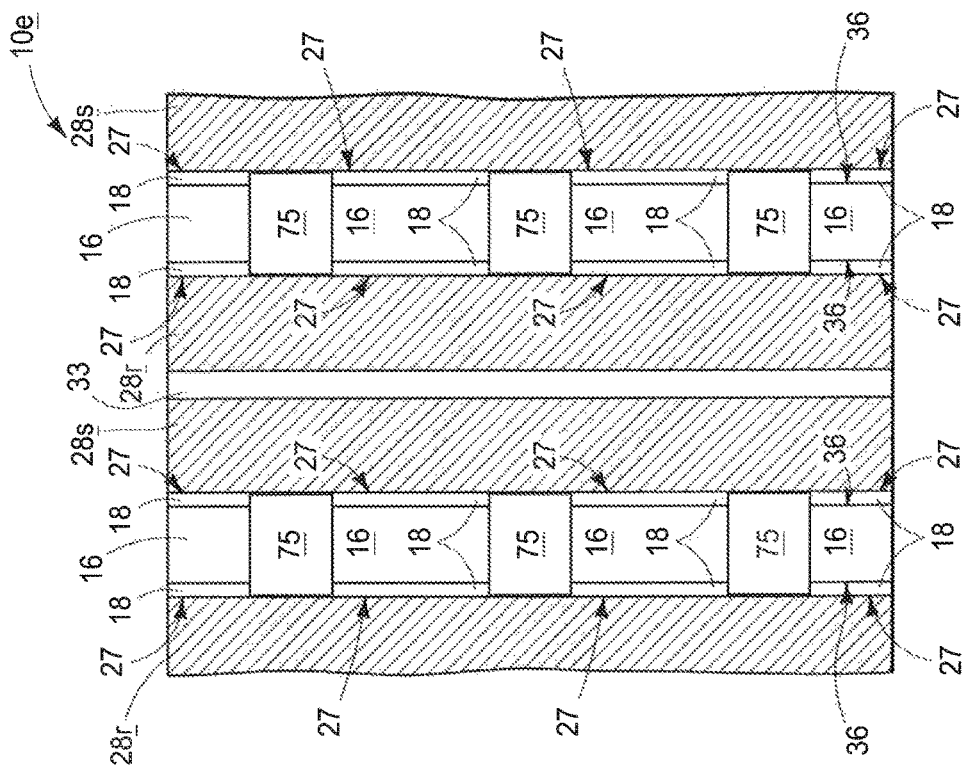
FIG. 17 is a sectional view taken through line 17-17 in FIG. 14.
Figure 16:
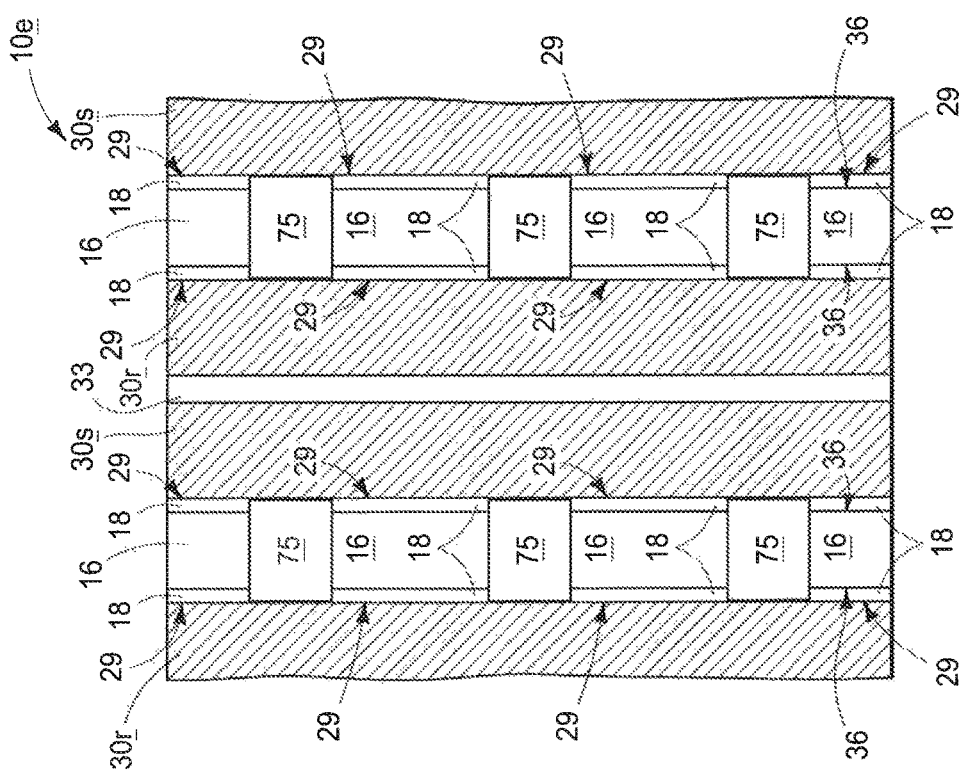
FIG. 16 is a sectional view taken through line 16-16 in FIG. 14.

A conductive contact is directly against a lateral outer sidewall of a) each of the transition metal dichalcogenide films that is elevationally beyond the outer tier of the opposing conductive gate material, or b) each of the transition metal dichalcogenide films that is elevationally beyond the inner tier of the opposing conductive gate material. FIGS. 14 and 16 show a conductive contact 30r and 30s directly against lateral outer sidewall 29 of each transition metal dichalcogenide film 18 that is elevationally beyond outer tier 44e of opposing conductive gate material 24r and 24s. FIGS. 14 and 17 show a conductive contact 28r and 28s directly against lateral outer sidewall 27 of each transition metal dichalcogenide film 18 that is elevationally beyond inner tier of opposing conductive gate material 24r and 24s. Any of the attributes described above with respect to the embodiments of FIGS. 6-9 may be used in the embodiments of FIGS. 14-17. Dielectric material 75 is shown extending through tiers 44e to isolate transition metal dichalcogenide films 18r and 18s from horizontally adjacent vertical strings 40e of laterally opposing pairs of vertical ferroelectric field effect transistors 42r and 42s. Dielectric material 75 may extend into and/or through materials 20 and/or 24r, 24s (not shown). Example dielectrics 75 include any of the materials described above with respect to the composition of material 12.

FIGS. 14-17 show an example embodiment wherein dielectric material 33 is between immediately adjacent conductive gate material 24r and 24s of different strings 40e. FIG. 18 shows an example alternate embodiment substrate fragment 10f (corresponding in cross-section to that of FIG. 15) wherein at least some immediately laterally adjacent of vertical strings 40f share a common horizontally extending line of the conductive gate material 24f in individual of the tiers, thereby perhaps increasing horizontal density. Like numerals from the above-described embodiments have been used where appropriate, with some construction differences being indicated with the suffix "f". Dielectric isolation (not shown) may be provided to laterally separate and electrically isolate conductive contacts that are directly against a sidewall of a transition metal dichalcogenide film that is elevationally beyond the outer or inner tiers of the opposing conductive gate material (not shown).

Use of a vertical transition metal dichalcogenide material or film that is from 1 monolayer to 7 monolayers thick as a channel in a vertical FeFET may reduce depolarization tendency of the ferroelectric dielectric, and/or may reduce an adverse high electric field that may exist between the ferroelectric dielectric and the channel.

CONCLUSION

In some embodiments, a vertical ferroelectric field effect transistor construction comprises an isolating core. A transition metal dichalcogenide material encircles the isolating core and has a lateral wall thickness of 1 monolayer to 7 monolayers. A ferroelectric gate dielectric material encircles the transition metal dichalcogenide material. Conductive gate material encircles the ferroelectric gate dielectric material. The transition metal dichalcogenide material extends elevationally inward and elevationally outward of the conductive gate material. A conductive contact is directly against a lateral outer sidewall of the transition metal dichalcogenide material that is a) elevationally inward of the conductive gate material, or b) elevationally outward of the conductive gate material.

In some embodiments, a construction comprising a pair of vertical ferroelectric field effect transistors comprises isolating material laterally between a pair of vertical ferroelectric field effect transistors. The pair of transistors comprises a transition metal dichalcogenide film over each of two opposing lateral sides of the isolating material and individually has a lateral thickness of 1 monolayer to 7 monolayers. A ferroelectric gate dielectric film is laterally outward of each of the transition metal dichalcogenide films. Conductive gate material is laterally outward of each of the ferroelectric gate dielectric films. The transition metal dichalcogenide films extend elevationally inward and elevationally outward of the conductive gate material on each of the two sides. A conductive contact is directly against a lateral outer sidewall of each of the transition metal dichalcogenide films that is a) elevationally inward of the conductive gate material, or b) elevationally outward of the conductive gate material.

In some embodiments, a vertical string of vertical ferroelectric field effect transistors comprises an isolating core. A transition metal dichalcogenide material encircles the isolating core and has a lateral wall thickness of 1 monolayer to 7 monolayers. A ferroelectric gate dielectric material encircles the transition metal dichalcogenide material. Alternating tiers of dielectric material and conductive gate material encircle the ferroelectric gate dielectric material. The transition metal dichalcogenide material and the ferroelectric material extend elevationally along the isolating core through the tiers. The transition metal dichalcogenide material extends elevationally beyond at least one of a) an elevationally outer of the conductive gate material tiers, and b) an elevationally inner of the conductive gate material tiers. A conductive contact is directly against a lateral outer sidewall of the transition metal dichalcogenide material that is elevationally beyond a) the outer tier of the conductive gate material, or b) the inner tier of the conductive gate material.

In some embodiments, a vertical string of laterally opposing pairs of vertical ferroelectric field effect transistors comprises alternating tiers of laterally opposing dielectric material and laterally opposing conductive gate material. The laterally opposing conductive gate material in individual of the tiers comprises a respective gate of one of a pair of laterally opposing vertical ferroelectric field effect transistors in that tier. Isolating material extends through the tiers laterally between the transistors of the respective pairs. A transition metal dichalcogenide film extends through the tiers over each of two opposing lateral sides of the isolating material between the isolating material and the laterally opposing conductive gate material. The transition metal dichalcogenide films individually have a lateral thickness of 1 monolayer to 7 monolayers. The transition metal dichalcogenide films extend elevationally beyond at least one of a) an elevationally outer of the laterally opposing conductive gate material tiers, and b) an elevationally inner of the laterally opposing conductive gate material tiers. A ferroelectric gate dielectric film extends through the tiers over each of two opposing lateral sides of the individual transition metal dichalcogenide films between the transition metal dichalcogenide films and the laterally opposing conductive gate material. A conductive contact is directly against a lateral outer sidewall of a) each of the transition metal dichalcogenide films that is elevationally beyond the outer tier of the opposing conductive gate material, or b) each of the transition metal dichalcogenide films that is elevationally beyond the inner tier of the opposing conductive gate material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An array of memory cells, individual of the memory cells comprising a vertical ferroelectric field effect transistor construction, the vertical field effect transistor comprising:
   an isolating core;
   a transition metal dichalcogenide material encircling the isolating core and having a lateral wall thickness of 1 monolayer to 7 monolayers;
   a ferroelectric gate dielectric material encircling the transition metal dichalcogenide material;
   conductive gate material encircling the ferroelectric gate dielectric material, the transition metal dichalcogenide material extending elevationally inward and elevationally outward of the conductive gate material; and
   a conductive contact directly against a lateral outer sidewall of the transition metal dichalcogenide material that is a) elevationally inward of the conductive gate material, or b) elevationally outward of the conductive gate material.

2. The array of claim 1 wherein the isolating core, the transition metal dichalcogenide material, and the ferroelectric gate dielectric material each have a respective perimeter that is circular in horizontal cross-section.

3. The array of claim 1 wherein the transition metal dichalcogenide material is no greater than 4 monolayers in lateral wall thickness.

4. The array of claim 3 wherein the transition metal dichalcogenide material is no greater than 2 monolayers in lateral wall thickness.

5. The array of claim 1 wherein the transition metal dichalcogenide material comprises at least one of $MoS_2$, $WS_2$, $InS_2$, $MoSe_2$, $WSe_2$, and $InSe_2$.

6. The array of claim 1 wherein material of the conductive contact that is directly against the sidewall is elemental metal, an alloy of elemental metals, and/or a conductive metal compound.

7. The array of claim 1 wherein material of the conductive contact that is directly against the sidewall is conductively doped semiconductive material.

8. The array of claim 1 wherein the ferroelectric gate dielectric material has a lateral wall thickness of 1 nanometer to 30 nanometers.

9. The array of claim 8 wherein the ferroelectric gate dielectric material has a lateral wall thickness of 2 nanometers to 10 nanometers.

10. The array of claim 1 wherein the transition metal dichalcogenide material is no greater than 2 monolayers in lateral wall thickness, and the ferroelectric gate dielectric material has a lateral wall thickness of 2 nanometers to 10 nanometers.

11. The array of claim 1 wherein the conductive contact is directly against the lateral outer sidewall of the transition metal dichalcogenide material that is elevationally outward of the conductive gate material.

12. The array of claim 1 wherein the transition metal dichalcogenide material has an elevationally outermost end surface and an elevationally innermost end surface, the conductive contact not being directly against the one of said end surfaces that is most-proximate the lateral outer sidewall of the transition metal dichalcogenide material that the conductive contact is laterally directly against.

13. The array of claim 1 wherein the transition metal dichalcogenide material has an elevationally outermost end surface and an elevationally innermost end surface, the conductive contact also being directly against the one of said end surfaces that is most-proximate the lateral outer sidewall of the transition metal dichalcogenide material that the conductive contact is laterally directly against.

14. The array of claim 13 wherein sidewall-surface area of the transition metal dichalcogenide material that the conductive contact is directly against is greater than end wall-surface area of the transition metal dichalcogenide material that the conductive contact is directly against.

15. The array of claim 1 wherein the conductive contact is directly against the lateral outer sidewall of the transition metal dichalcogenide material that is elevationally inward of the conductive gate material.

16. The array of claim 1 wherein the conductive contact is directly against the lateral outer sidewall of the transition metal dichalcogenide material that is elevationally outward of the conductive gate material, and comprising another conductive contact that is directly against the lateral outer sidewall of the transition metal dichalcogenide material that is elevationally inward of the conductive gate material.

17. The array of claim 16 wherein the transition metal dichalcogenide material has an elevationally outermost end surface and an elevationally innermost end surface, the conductive contact not being directly against the outermost end surface, the another conductive contact not being directly against the innermost end surface.

18. The array of claim 16 wherein the transition metal dichalcogenide material has an elevationally outermost end surface and an elevationally innermost end surface, at least one of the conductive contact and the another conductive contact being directly against the elevationally outermost end surface or the elevationally innermost end surface, respectively.

19. The array of claim 18 wherein the conductive contact is directly against the elevationally outermost end surface and the another conductive contact is directly against the elevationally innermost end surface.

20. An array of memory cells, the memory cells comprising a vertical string of vertical ferroelectric field effect transistors, the vertical string of vertical ferroelectric field effect transistors comprising:

an isolating core;

a transition metal dichalcogenide material encircling the isolating core and having a lateral wall thickness of 1 monolayer to 7 monolayers;

a ferroelectric gate dielectric material encircling the transition metal dichalcogenide material;

alternating tiers of dielectric material and conductive gate material encircling the ferroelectric gate dielectric material, the transition metal dichalcogenide material and the ferroelectric material extending elevationally along the isolating core through the tiers, the transition metal dichalcogenide material extending elevationally beyond at least one of a) an elevationally outer of the conductive gate material tiers, and b) an elevationally inner of the conductive gate material tiers; and a conductive contact directly against a lateral outer sidewall of the transition metal dichalcogenide material that is elevationally beyond a) the outer tier of the conductive gate material, or b) the inner tier of the conductive gate material.

21. The array of claim 20 comprising a NAND array of said vertical strings of vertical ferroelectric field effect transistors.

22. The array of claim 20 wherein the vertical string is a NAND string.

23. The array of claim 20 wherein the elevationally outer tier comprises the dielectric material.

24. The array of claim 23 wherein the transition metal dichalcogenide material extends elevationally beyond the elevationally outer of the dielectric material tiers.

25. The array of claim 20 wherein the elevationally inner tier comprises the dielectric material.

26. The array of claim 25 wherein the transition metal dichalcogenide material extends elevationally beyond the elevationally inner of the dielectric material tiers.

* * * * *